US006150260A

United States Patent [19]

Roy

[11] Patent Number: 6,150,260

[45] Date of Patent: Nov. 21, 2000

[54] SACRIFICIAL STOP LAYER AND ENDPOINT FOR METAL CMP

[75] Inventor: Sudipto Ranendra Roy, Spring Grove, Singapore

[73] Assignee: Chartered Semiconductor Manufacturing Ltd., Singapore, Singapore

[21] Appl. No.: 09/110,419

[22] Filed: Jul. 6, 1998

[51] Int. Cl.[7] .................... H01L 21/4763

[52] U.S. Cl. .................... 438/629; 438/626; 438/631; 438/959

[58] Field of Search .................... 438/633, 631, 438/626, 959, 629

[56] References Cited

U.S. PATENT DOCUMENTS

| | | | |
|---|---|---|---|
| 5,364,817 | 11/1994 | Lur et al. | 437/192 |
| 5,502,008 | 3/1996 | Hayakawa et al. | 437/225 |
| 5,595,937 | 1/1997 | Mikagi | 437/192 |
| 5,674,781 | 10/1997 | Huang et al. | 437/192 |
| 5,953,635 | 9/1999 | Andideh | 438/761 |

*Primary Examiner*—Wael Fahmy
*Assistant Examiner*—Neal Berezny
*Attorney, Agent, or Firm*—George O. Saile; Rosemary L.S. Pike

[57] ABSTRACT

A new method of metal plug metallization utilizing a sacrificial layer as a CMP stop to protect the oxide layer from damage during CMP is described. Semiconductor device structures are provided in and on a semiconductor substrate. An insulating layer covers the semiconductor device structures. A sacrificial titanium nitride layer is deposited overlying the insulating layer. An opening is etched through the sacrificial layer and the insulating layer to one of the semiconductor device structures. A glue layer is deposited conformally over the surface of the sacrificial layer and within the opening. A barrier layer is deposited overlying the glue layer. A metal layer is deposited overlying the barrier layer. Chemical mechanical polishing is used to polish away the metal layer, barrier layer, and glue layer overlying the insulating layer wherein the sacrificial layer acts as a polish stop and an endpoint detector and protects the insulating layer from the polishing thereby preventing erosion and dishing to complete formation of said metal plug metallization in the fabrication of an integrated circuit.

26 Claims, 4 Drawing Sheets

SACRIFICIAL STOP LAYER AND ENDPOINT FOR METAL CMP

BACKGROUND OF THE INVENTION (1) Field of the Invention

The invention relates to a method of metallization in the fabrication of integrated circuits, and more particularly, to a method of polishing a metal stack in the manufacture of integrated circuits.

(2) Description of the Prior Art

Tungsten-plug metallization is well-known in the art. A conventional tungsten plug process of the prior art is illustrated in FIG. 1. Referring now to FIG. 1, there is shown semiconductor substrate 10. A contact, via, or trench is patterned into an oxide layer 20 to an underlying region 11. A metal film stack is deposited; for example, a titanium glue layer 22 is deposited over the oxide layer and within the opening. A titanium nitride barrier layer 24 is deposited over titanium glue layer. A layer of tungsten 26 is deposited which will form a plug within the opening. The metal film stack is then polished using chemical mechanical polishing (CMP) to remove the excess metal material, stopping on the oxide layer, as shown in FIG. 2.

Since titanium polishes much more slowly than tungsten or other metals, during the process of removing the titanium, severe erosion (illustrated by A), dishing (illustrated by B), and non-uniformity across the wafer occur. This makes the integration of metal CMP to manufacturing very difficult. All of these problems are extremely undesirable and adversely affect the electrical performance of the integrated circuit device. Unfortunately, there is no metal CMP process or CMP consumable set with a metal removal rate that has both low selectivity to titanium and very high selectivity to oxide.

It is desirable to use titanium not only as the glue layer but also for silicide and salicide processes. The titanium reacts with the underlying polysilicon in a contact application and forms titanium silicide which reduces contact resistance.

U.S. Pat. No. 5,502,008 to Hayakawa et al and U.S. Pat. No. 5,674,781 to Huang et al both show CMP of a titanium nitride/tungsten stack. U.S. Pat. No. 5,364,817 to Lur et al teaches forming a titanium nitride barrier layer under a tungsten layer where the barrier layer remains under an overlying aluminum layer. No CMP is performed. U.S. Pat. No. 5,595,937 to Mikagi discloses a CMP of a titanium nitride/titanium/copper stack with a stop on silicon oxide.

SUMMARY OF THE INVENTION

A principal object of the present invention is to provide an effective and very manufacturable method of plug metallization in which the oxide layer is protected from damage during CMP.

Another object of the invention is to provide a method of tungsten plug metallization in which the oxide layer is protected from damage during CMP.

Yet another object is to provide a method of tungsten plug metallization utilizing a sacrificial layer as a CMP stop to protect the oxide layer from damage during CMP.

A still further object of the invention is to provide a method of tungsten plug metallization utilizing a semi-sacrificial layer as a CMP stop to protect the oxide layer from damage during CMP.

Yet another object of the invention is to provide a method of tungsten plug metallization utilizing a titanium nitride sacrificial layer as a CMP stop to protect the oxide layer from damage during CMP.

Yet another object of the invention is to provide a method of plug metallization utilizing a titanium nitride sacrificial layer as a CMP stop to prevent erosion and dishing.

In accordance with the objects of this invention a new method of metal plug metallization utilizing a sacrificial layer as a CMP stop to protect the oxide layer from damage during CMP is achieved. Semiconductor device structures are provided in and on a semiconductor substrate. An insulating layer covers the semiconductor device structures. A sacrificial titanium nitride layer is deposited overlying the insulating layer. An opening is etched through the sacrificial layer and the insulating layer to one of the semiconductor device structures. A glue layer is deposited conformally over the surface of the sacrificial layer and within the opening. A barrier layer is deposited overlying the glue layer. A metal layer is deposited overlying the barrier layer. Chemical mechanical polishing is used to polish away the metal layer, barrier layer, and glue layer overlying the insulating layer wherein the sacrificial layer acts as a polish stop and an endpoint detector and protects the insulating layer from the polishing thereby preventing erosion and dishing to complete formation of metal plug metallization in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 3:
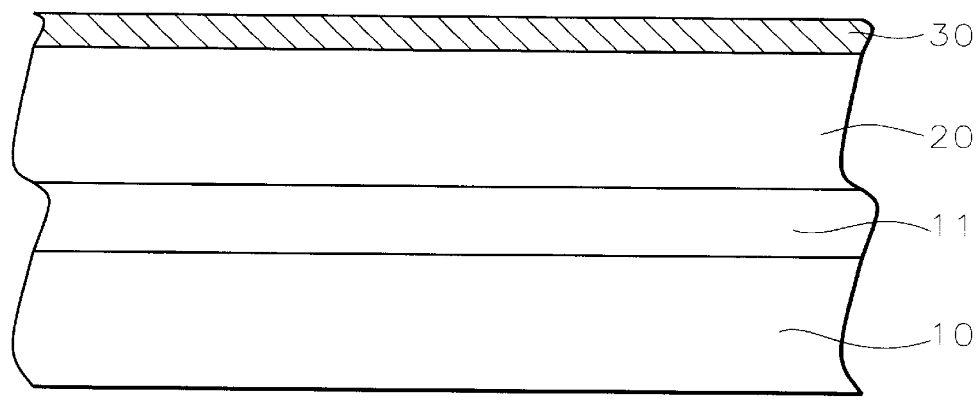
FIGS. 3 through 5 schematically illustrate in cross-sectional representation a preferred embodiment of the present invention.

Referring now more particularly to FIG. 3, there is illustrated an enlarged portion of a partially completed integrated circuit. There is shown a semiconductor substrate 10, preferably composed of monocrystalline silicon. Semiconductor device structures, not shown, are formed in and on the semiconductor substrate within the area labeled 11 as is conventional in the art and are covered by a thick insulating layer 20. This insulating layer is typically an oxide, such as silicon dioxide, tetraethoxysilane (TEOS) oxide, borophosphosilicate glass (BPSG), or the like.

The problem of polishing a metal stack using CMP is that the titanium glue layer polishes much more slowly then tungsten or other metals. However, titanium nitride has a polish rate comparable to that of tungsten or other metals. Therefore, a layer of titanium nitride will be deposited overlying the oxide layer as a protective polish stop layer. A layer of titanium nitride 30 is deposited over the oxide layer 20, as illustrated in FIG. 3, to a thickness of between about 200 and 2500 Angstroms.

Figure 4:
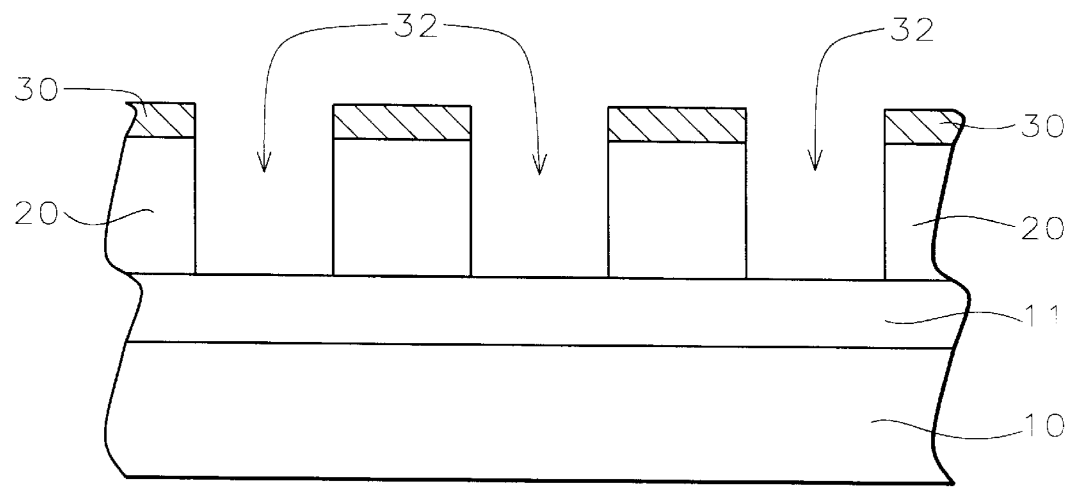

A contact, via, or trench 32 is etched through the titanium nitride layer 30 and the oxide layer 20, as shown in FIG. 4.

Typically, the contact or via will be opened to an underlying semiconductor device structure such as a gate electrode, source/drain region, or metal line. The underlying device structure is not shown in the figures.

Figure 5:
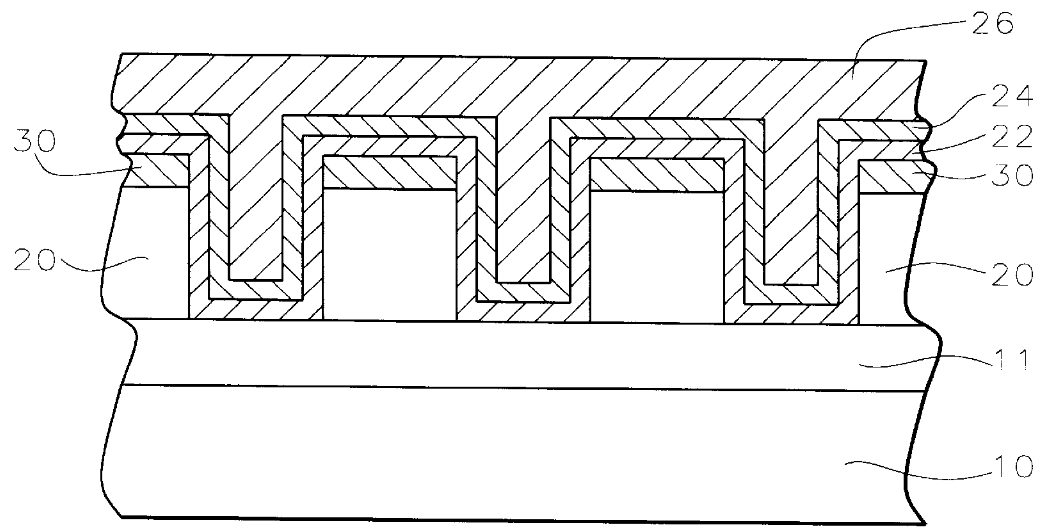

Referring now to FIG. 5, a glue layer 22 is deposited conformally over the surface of the sacrificial titanium nitride layer 30 and within the opening 32. The glue layer preferably is composed of titanium and is deposited by chemical vapor deposition (CVD) or physical vapor deposition (PVD) to a thickness of between about 200 to 1000 Angstroms. A titanium nitride barrier layer 24 is deposited conformally over the glue layer 22 by CVD or PVD to a thickness of between about 200 to 1000 Angstroms.

The metal layer 26 is blanket deposited over the surface of the substrate to a thickness of between about 4000 and 9000 Angstroms. The metal layer be preferably be tungsten or aluminum or an aluminum alloy.

Figure 1:
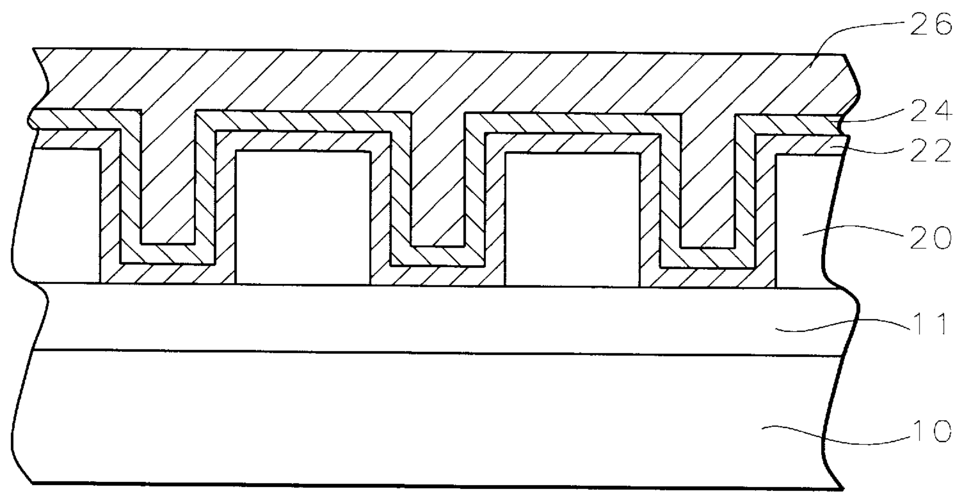
FIGS. 1 and 2 schematically illustrate in cross-sectional representation a conventional tungsten plug process of the prior art.
Figure 2:
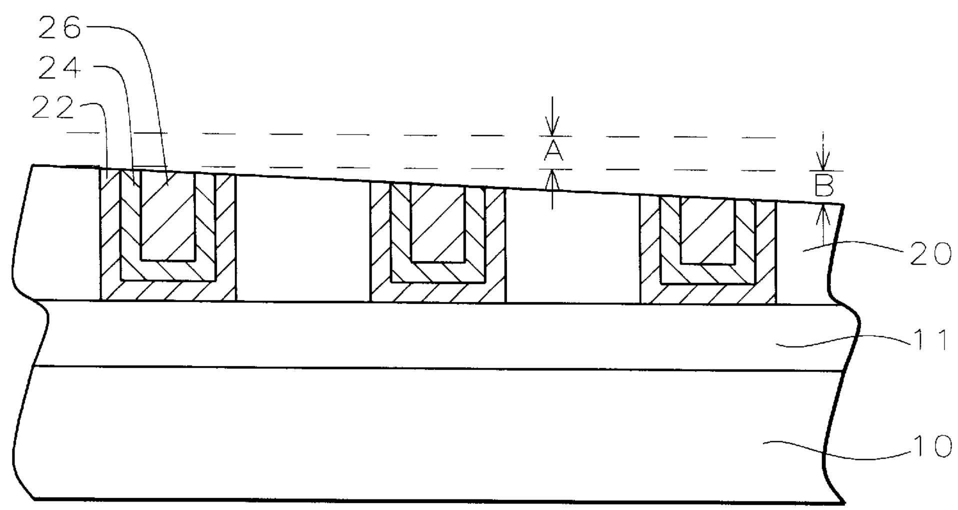
Figure 6A:
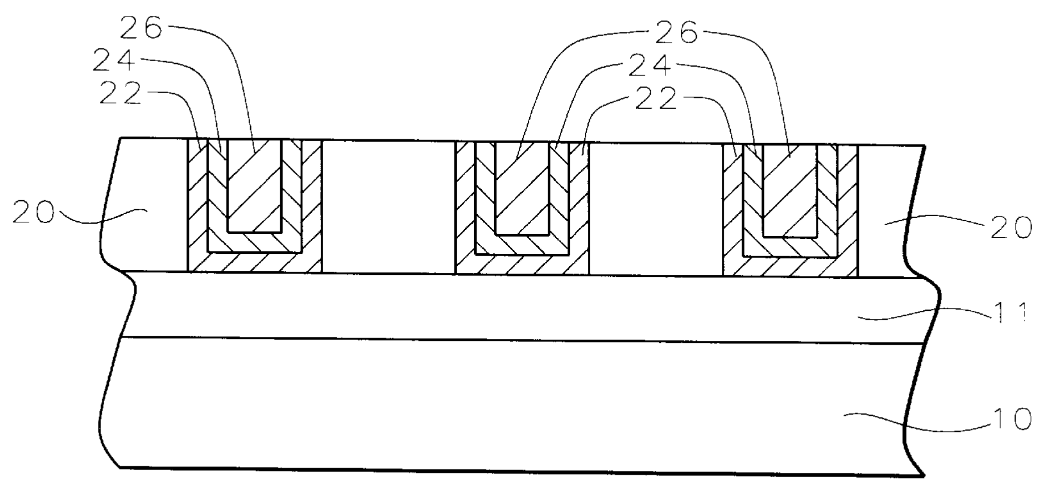
FIGS. 6A and 6B schematically illustrate in cross-sectional representation two alternatives in the process of the present invention.

Referring now to FIG. 6A, the metal stack is polished using chemical mechanical polishing (CMP) to remove the excess metal overlying the oxide layer. The sacrificial titanium nitride layer 30 protects the oxide layer from exposure to the CMP slurry. Metallic and ionic contaminants to the oxide surface are thus eliminated thereby increasing device reliability. The titanium nitride layer 30 also protects the oxide layer from the prior art problems of erosion, dishing, and non-uniformity, shown in FIG. 2, caused by the very slow etch rate of titanium. The process of the present invention eliminates the dishing and erosion problems of the prior art. FIG. 6A shows the desired flat profile after CMP.

Another important advantage of the sacrificial titanium nitride layer 30 is that the layer also acts as an endpoint detector. In the prior art process, the point at which the titanium is completely polished away and polishing begins to be performed on the silicon oxide layer is not easy to detect. There is no clear endpoint because the selectivity of titanium to silicon oxide is low. However, the current draw when the silicon oxide is being polished is much greater than when the titanium nitride is being polished. The current draw is a clearly detected endpoint.

Titanium polishes much more slowly than oxide. In the prior art process, before all of the titanium is removed from the surface, the CMP process begins to polish titanium and oxide simultaneously. The oxide removal at this point is undesirable, causing severe erosion and dishing. Since both titanium and oxide are being polished, there is no effective endpoint. However, titanium nitride polishes faster than titanium. Therefore, in the process of the present invention, complete removal of the titanium nitride sacrificial layer occurs before oxide is polished. Thus, the endpoint is effective.

FIG. 6A illustrates the alternative in which the titanium nitride layer 30 is fully sacrificial and is completely removed by the CMP.

Figure 6B:
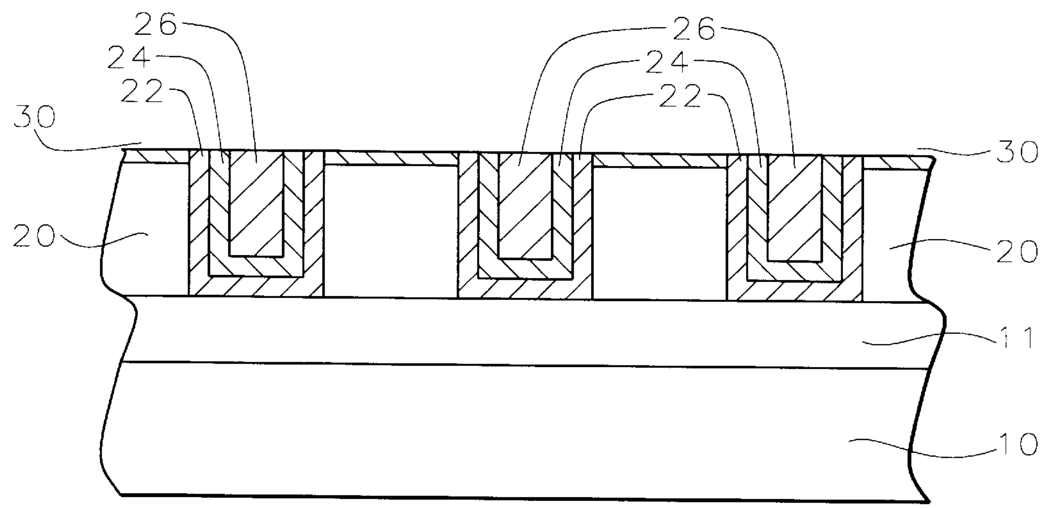

FIG. 6B illustrates the alternative in which the titanium nitride layer 30 is semi-sacrificial. Only a portion of the layer is polished away. In a subsequent step of depositing another barrier layer and an overlying metal layer, such as aluminum, the presence of the thin titanium nitride layer 30 allows the subsequent barrier layer to be much thinner than normal.

Figure 7:
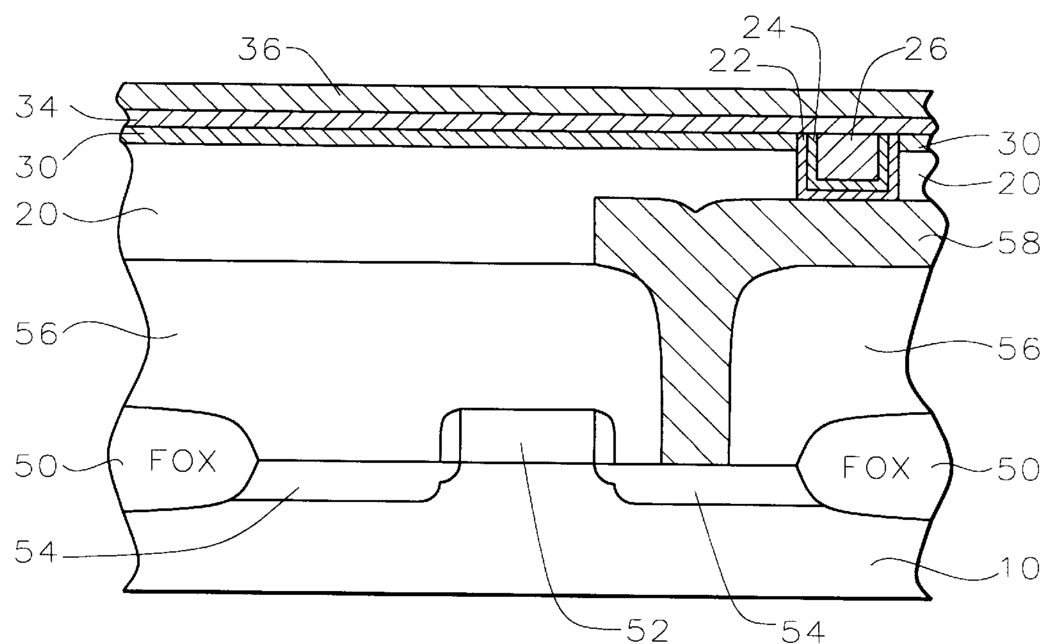
FIG. 7 schematically illustrates in cross-sectional representation a completed integrated circuit device fabricated using the process of the present invention.

This is illustrated in FIG. 7 in which the view of FIGS. 3–6 has been expanded to show one of the metal plugs 26 and to include the semiconductor device structures as shown. Field oxide regions 50 separate the active region shown from other active regions not shown. Gate electrode 52 and associated source and drain regions 54 have been formed in and on the semiconductor substrate. These structures have been covered by an insulating layer 56. A conducting layer 58 extends through an opening in the insulating layer 56 to one of the underlying source/drain regions 54. Oxide layer 20 has been deposited over this conducting layer. The metal plug of the present invention is shown contacting the conducting layer 58. A second titanium nitride barrier layer 34 is deposited over the semi-sacrificial layer 30 and the metal plug 26. Because of the presence of the layer 30, this layer 34 can be thinner than normal. If the layer 30 is completely removed, as shown in FIG. 6A, the layer 34 will be of conventional thickness. In this case, 30/34 represents the deposited barrier layer after the CMP has been completed. A metal layer 36, such as aluminum is deposited over the barrier layer 34 to complete the contact to the metal plug.

Other processes may now be performed such as an intermetal dielectric deposition and further metallization, as is well known in the art.

FIG. 7 illustrates one example of the use of the metal plug metallization process of the present invention. It will be understood by those skilled in the art, that the process of the invention can be used in any level of metal plug metallization, whether in a via opening contacting a metal line as shown in FIG. 7, or in a contact opening or trench.

The process of the present invention includes the use of a sacrificial or semi-sacrificial titanium nitride stop layer for metal CMP. The impact of the invention is the elimination of dishing, erosion, and non-uniformity problems caused by prior art CMP processes as well as the protection of the oxide surface from the CMP slurry. The titanium nitride stop layer also serves as an excellent end point indicator for the CMP process. The semi-sacrificial titanium nitride layer can act as part of a subsequent barrier layer for subsequent metallization.

While the invention has been particularly shown and described with reference to the preferred embodiments thereof, it will be understood by those skilled in the art that various changes in form and details may be made without departing from the spirit and scope of the invention.

What is claimed is:

1. A method of forming metal plug metallization in the fabrication of integrated circuits comprising:

providing semiconductor device structures in and on a semiconductor substrate;

providing an insulating layer covering said semiconductor device structures;

depositing a sacrificial layer comprising titanium nitride overlying said insulating layer;

etching an opening through said sacrificial layer and said insulating layer to one of said semiconductor device structures;

depositing a glue layer conformally over the surface of said sacrificial layer and within said opening;

depositing a barrier layer overlying said glue layer; depositing a metal layer overlying said barrier metal layer; and polishing away said metal layer, said barrier layer, and said glue layer overlying said insulating layer wherein said sacrificial layer acts as a polish stop and an endpoint detector and wherein said sacrificial layer protects said insulating layer from said polishing to complete said formation of said metal plug metallization in said fabrication of said integrated circuit.

2. The method according to claim 1 wherein said semiconductor device structures include gate electrodes and source and drain regions and wherein said one of said semiconductor device structure to be contacted is one of said source and drain regions.

3. The method according to claim 1 wherein said semiconductor device structures include gate electrodes and source and drain regions and wherein said one of said semiconductor device structure to be contacted is one of said gate electrodes.

4. The method according to claim 1 wherein said semiconductor device structures include gate electrodes and source and drain regions and overlying metal lines and wherein said one of said semiconductor device structure to be contacted is one of said metal lines.

5. The method according to claim 1 wherein said insulating layer comprises silicon oxide.

6. The method according to claim 1 wherein said titanium nitride layer has a thickness of between about 200 and 2500 Angstroms.

7. The method according to claim 1 wherein said glue layer comprises titanium having a thickness of between about 200 and 1000 Angstroms.

8. The method according to claim 1 wherein said barrier layer comprises titanium nitride having a thickness of between about 200 and 1000 Angstroms.

9. The method according to claim 1 wherein said metal layer comprises tungsten.

10. The method according to claim 1 wherein said metal layer comprises aluminum.

11. The method according to claim 1 wherein said sacrificial layer is partially removed during said polishing.

12. The method according to claim 1 wherein said sacrificial layer is completely removed during said polishing.

13. The method according to claim 1 wherein said polishing comprises chemical mechanical polishing.

14. The method according to claim 1 wherein said sacrificial layer prevents erosion and dishing.

15. A method of forming tungsten plug metallization in the fabrication of integrated circuits comprising:

providing semiconductor device structures in and on a semiconductor substrate;

providing an insulating layer covering said semiconductor device structures;

depositing a sacrificial layer comprising titanium nitride overlying said insulating layer;

etching an opening through said sacrificial layer and said insulating layer to one of said semiconductor device structures;

depositing a titanium layer conformally over the surface of said sacrificial layer and within said opening;

depositing a titanium nitride barrier layer overlying said titanium layer;

depositing a tungsten layer overlying said titanium nitride barrier layer; and polishing away said tungsten layer, said titanium nitride barrier layer, and said titanium layer overlying said insulating layer wherein said sacrificial layer acts as a polish stop and an endpoint detector, wherein said sacrificial layer is completely removed, and wherein said sacrificial layer protects said insulating layer from said polishing and prevents erosion and dishing to complete said formation of said tungsten plug metallization in said fabrication of said integrated circuit.

16. The method according to claim 15 wherein said semiconductor device structures include gate electrodes and source and drain regions and wherein said one of said semiconductor device structure to be contacted is one of said source and drain regions.

17. The method according to claim 15 wherein said semiconductor device structures include gate electrodes and source and drain regions and wherein said one of said semiconductor device structure to be contacted is one of said gate electrodes.

18. The method according to claim 15 wherein said semiconductor device structures include gate electrodes and source and drain regions and overlying metal lines and wherein said one of said semiconductor device structure to be contacted is one of said metal lines.

19. The method according to claim 15 wherein said sacrificial layer has a thickness of between about 200 and 2500 Angstroms.

20. The method according to claim 15 wherein said polishing comprises chemical mechanical polishing.

21. A method of forming tungsten plug metallization in the fabrication of integrated circuits comprising:

providing semiconductor device structures in and on a semiconductor substrate;

providing an insulating layer covering said semiconductor device structures;

depositing a titanium nitride sacrificial layer overlying said insulating layer;

etching an opening through said titanium nitride sacrificial layer and said insulating layer to one of said semiconductor device structures;

depositing a titanium layer conformally over the surface of said titanium nitride sacrificial layer and within said opening;

depositing a titanium nitride barrier layer overlying said titanium layer;

depositing a tungsten layer overlying said titanium nitride barrier layer; and polishing away said tungsten layer, said titanium nitride barrier layer, and said titanium layer overlying said insulating layer wherein said titanium nitride sacrificial layer acts as a polish stop and an endpoint detector, wherein said sacrificial layer is partially removed, and wherein said titanium nitride sacrificial layer protects said insulating layer from said polishing and prevents erosion and dishing to complete said formation of said tungsten plug metallization in said fabrication of said integrated circuit.

22. The method according to claim 21 wherein said semiconductor device structures include gate electrodes and source and drain regions and wherein said one of said semiconductor device structure to be contacted is one of said source and drain regions.

23. The method according to claim 21 wherein said semiconductor device structures include gate electrodes and source and drain regions and wherein said one of said semiconductor device structure to be contacted is one of said gate electrodes.

24. The method according to claim 21 wherein said semiconductor device structures include gate electrodes and source and drain regions and overlying metal lines and wherein said one of said semiconductor device structure to be contacted is one of said metal lines.

25. The method according to claim 21 wherein said titanium nitride sacrificial layer has a thickness of between about 200 and 2500 Angstroms.

26. The method according to claim 21 wherein said polishing comprises chemical mechanical polishing.

* * * * *

UNITED STATES PATENT AND TRADEMARK OFFICE

CERTIFICATE OF CORRECTION

PATENT NO. : 6,150,260

DATED : 11/21/00

INVENTOR(S) : Sudipto R. Roy

It is certified that error appears in the above-identified patent and that said Letters Patent is hereby corrected as shown below:

In the Title page, initem (75), please replace "Spring Grove" with --Singapore--.

Signed and Sealed this

First Day of May, 2001

Attest:

Nicholas P. Godici

NICHOLAS P. GODICI

Attesting Officer

*Acting Director of the United States Patent and Trademark Office*